United States Patent
Maeda et al.

(10) Patent No.: US 10,285,318 B2
(45) Date of Patent: May 7, 2019

(54) LEAD POSITION DETECTING APPARATUS AND COMPONENT INSERTING MACHINE

(71) Applicant: FUJI CORPORATION, Chiryu (JP)

(72) Inventors: Haruaki Maeda, Chiryu (JP); Satoru Otsubo, Chiryu (JP); Tsuyoshi Hamane, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 216 days.

(21) Appl. No.: 14/910,589

(22) PCT Filed: Aug. 7, 2013

(86) PCT No.: PCT/JP2013/071436
§ 371 (c)(1),
(2) Date: Feb. 5, 2016

(87) PCT Pub. No.: WO2015/019456
PCT Pub. Date: Feb. 12, 2015

(65) Prior Publication Data
US 2016/0198601 A1 Jul. 7, 2016

(51) Int. Cl.
*B23P 19/00* (2006.01)
*H05K 13/08* (2006.01)
*H05K 13/04* (2006.01)

(52) U.S. Cl.
CPC ......... *H05K 13/08* (2013.01); *H05K 13/0404* (2013.01); *H05K 13/0421* (2013.01); *H05K 13/0812* (2018.08); *H05K 13/0813* (2018.08)

(58) Field of Classification Search
CPC ............... H05K 13/08; H05K 13/0404; H05K 13/0421
See application file for complete search history.

(56) References Cited

U.S. PATENT DOCUMENTS 5,052,606 A * 10/1991 Cipolla ............ H01L 21/67132
156/552
5,372,972 A * 12/1994 Hayashi ............ H01L 21/67144
228/179.1
(Continued)

FOREIGN PATENT DOCUMENTS

JP 62-143497 A 6/1987
JP 2-049499 A 2/1990
(Continued)

OTHER PUBLICATIONS

International Search Report dated Sep. 10, 2013 in PCT/JP2013/071436 filed Aug. 7, 2013.
(Continued)

*Primary Examiner* — Paul D Kim
(74) *Attorney, Agent, or Firm* — Oblon, McClelland, Maier & Neustadt, L.L.P.

(57) ABSTRACT

A component inserting machine includes a gripping device which grips leads of an insert component which is supplied to a component supplying section using a pair of clamp members, X and Y robots which move the gripping device, a lead imaging device which images the leads which are gripped by the clamp members, and a control section which detects lead positions from an image containing the leads which are imaged by the lead imaging device and inserts the leads which are gripped by one of the clamp members into the insertion holes by moving the gripping device using the X and Y robots based on the lead positions.

8 Claims, 10 Drawing Sheets

(56) References Cited

U.S. PATENT DOCUMENTS 7,028,397 B2 * 4/2006 Abe .................. H01L 24/83
156/521
7,076,094 B2 * 7/2006 Chi .................. G06T 7/0002
29/833

FOREIGN PATENT DOCUMENTS

| JP | 249499 A * | 2/1990 |
| JP | 3-284900 | 12/1991 |
| JP | 3284900 A * | 12/1991 |

OTHER PUBLICATIONS

Chinese Office action dated Mar. 26, 2018 for Chinese Application No. 201380078711.4, and English translation thereof.

* cited by examiner

_US 10,285,318 B2_

LEAD POSITION DETECTING APPARATUS AND COMPONENT INSERTING MACHINE

TECHNICAL FIELD

The present disclosure relates to a technique of detecting lead positions of an insert component when gripping the insert component and insertion mounting the insert component on an electronic printed circuit board.

BACKGROUND ART

As illustrated in PTL 1, in the related art, there is a technique of automatically inserting leads of an insert component into insertion holes of an electronic printed circuit board to insertion mount the insert component on the electronic printed circuit board. PTL 1 discloses a technique of inserting leads into insertion holes by imaging an insert component with an imaging device in a state in which a main body portion of the insert component is gripped, detecting a distal end position of the lead from the image in which the insert component is imaged, and detecting the relative positions of the leads and the insertion holes.

CITATION LIST

Patent Literature

PTL 1: JP-A-62-143497

BRIEF SUMMARY

Problem to be Solved

In the technique disclosed in PTL 1, since the main body portion of the insert component is gripped, when the gripped insert component is inclined, not only the distal ends of the leads, but also the peripheral surface of the leads appears in the image which is captured by the imaging device. A metal surface of the main body portion from which the leads protrude also appears in the image which is captured by the imaging device. Therefore, there is a case in which it is not possible to distinguish the lead distal ends from other portions, and there is a case in which it is not possible to accurately detect the distal end positions of the leads. Therefore, there is a case in which it is not possible to insert the leads into the insertion holes, leading to an insertion error. This is caused by the detection of the relative positions of the leads and the insertion holes not being accurate.

Since the lead positions are detected by the imaging device and the movement amount of the gripped insert component is corrected each time an insert component is inserted into the insertion holes, there is a problem in that the cycle time in which the leads are inserted into the insertion holes increases in length.

The present disclosure was made in light of these issues, and an object thereof is to provide a technique capable of detecting the lead positions when insertion mounting insert components on an electronic printed circuit board.

Solution to Problem

The disclosure which was made in order to solve the problem described above includes a main body, a gripping device which grips leads of an insert component using a pair of clamp members, a movement device which is attached to the main body and moves the gripping device, an imaging device which images the leads which are gripped by the pair of clamp members, and a lead position detection section which detects lead positions from an image containing the leads which are imaged by the imaging device.

In this manner, since the leads are imaged in a state in which the leads are gripped by the clamp members and the lead positions are detected, it is possible to suppress the inclination of the insert component during the imaging, and, since the insert component of the portion other than the lead distal ends is hidden by the clamp members, it is possible to distinguish the leads and the other portions, and it is possible to reliably detect the lead positions.

The disclosure which was made in order to solve the problem described above is a component inserting machine which inserts leads of an insert component into insertion holes of an electronic printed circuit board to mount the insert component on the electronic printed circuit board. The component inserting machine includes a main body, a gripping device which grips the leads of the insert component which is supplied to a component supplying section using a pair of clamp members, a movement device which is attached to the main body and moves the gripping device, an imaging device which images the leads which are gripped by the pair of clamp members, a lead position detection section which detects lead positions from an image containing the leads which are imaged by the imaging device, and a control section which inserts the leads which are gripped by the pair of clamp members into the insertion holes by moving the gripping device using the movement device based on the lead positions which are detected by the lead position detection section.

In this manner, since the leads are imaged in a state in which the leads are gripped by the clamp members and the lead positions are detected, it is possible to suppress the inclination of the insert component during the imaging, and, since the insert component of the portion other than the lead distal ends is hidden by the clamp members, it is possible to distinguish the leads and the other portions, and it is possible to reliably detect the lead positions. Since the gripping device is moved by the movement device based on the lead positions, it is possible to reliably insert the leads into the insertion holes, and it is possible to reliably insertion mount the insert component on the electronic printed circuit board.

According to an aspect, in the invention of claim 2, lead position restriction sections which restrict positions of the leads in relation to the clamp members when gripping the leads are formed in at least one of the pair of clamp members. Accordingly, since the pair of leads is corrected by the lead position restriction section and the inter-lead distance is corrected to an appropriate value when the leads are gripped by the clamp members, it is possible to reliably insert the leads into the insertion holes.

According to an aspect, the component inserting machine further includes a lead position memory section which stores the lead positions which are detected by the lead position detection section, in which, for the insert components after the lead positions are detected by the lead position detection section, the control section causes the leads which are gripped by the gripping device to be inserted into the insertion holes by moving the gripping device using the movement device based on the lead positions which are stored in the lead position memory section.

In this manner, for the insert components after the lead positions are detected, the leads are inserted into the insertion holes based on the lead positions which are stored in the lead position memory section. As described above, when the leads are gripped by the pair of clamp members, the leads are corrected by the lead position restriction sections. Therefore, once the lead positions are detected, the leads of the insert component which is supplied to the component supplying section are corrected to the detected lead positions even if the lead positions are not detected every time, and it is possible to reliably insert the leads into the insertion holes. In this manner, since it is not necessary to perform the detection of the lead positions for every insertion mounting of the insert component, it is possible to shorten the cycle time in which the leads are inserted into the insertion holes, and the productivity of the insertion mounting is improved.

According to an aspect, the lead position restriction sections are V-shaped grooves which are formed in an opposing surface of at least one of the clamp members. Accordingly, when the leads are gripped by the clamp members, the leads are pushed into the bottom portion side of the V-shaped grooves, and it is possible to reliably correct the leads. Furthermore, it is possible to support leads which have different wire diameters.

According to an aspect, the gripping device is configured such that a base portion of the insert component from which the leads extend is hidden by the clamp members when viewing the insert component which is gripped by the pair of clamp members from the imaging device. Accordingly, since the base portion of the insert component does not appear in the image containing the leads which is captured by the imaging device, it is possible to reliably recognize the leads and it is possible to reliably detect the lead positions.

According to an aspect, the pair of clamp members has a brightness difference in relation to the leads. Accordingly, it is possible to reliably distinguish the pair of clamp members and the leads, it is possible to reliably recognize the leads, and it is possible to reliably detect the lead positions.

DESCRIPTION OF EMBODIMENTS (Component inserting machine)

Figure 1:
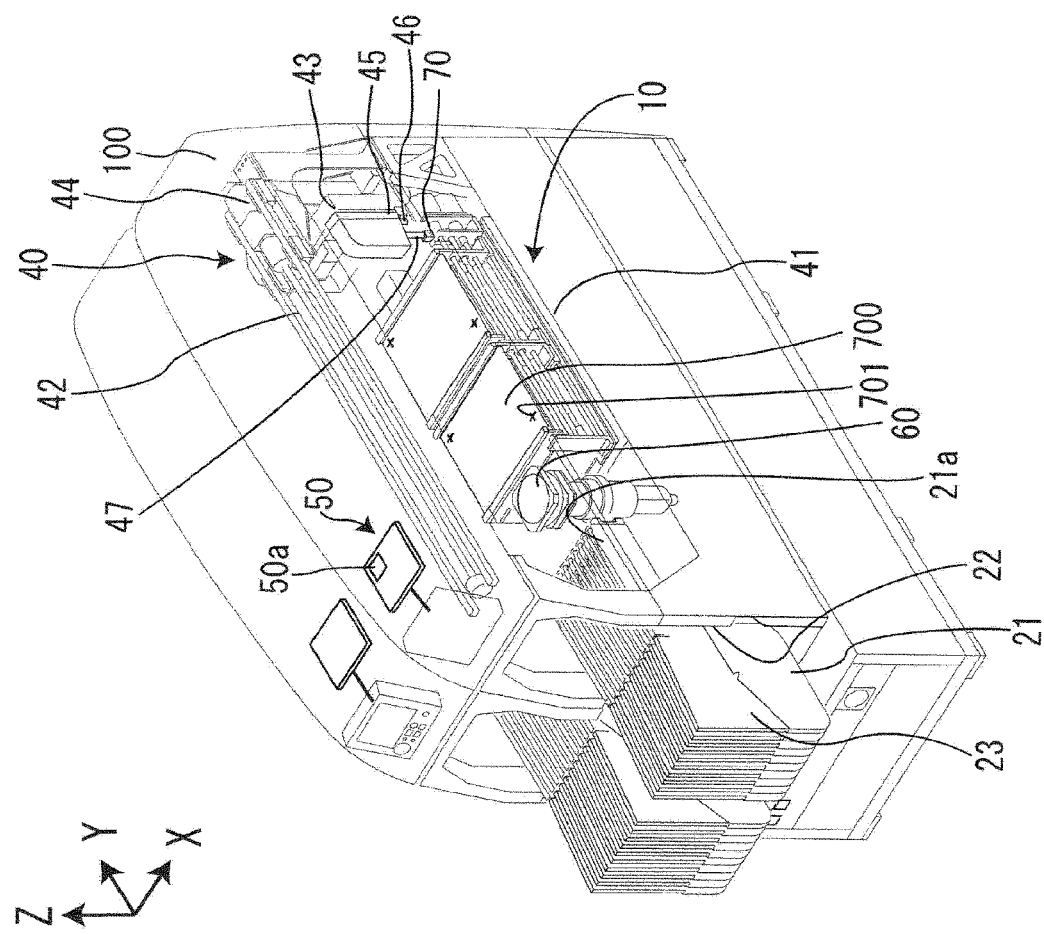
FIG. 1 is an overall perspective view of a component inserting machine of the present embodiment.

As illustrated in FIG. 1, a component inserting machine 100 includes aboard conveyance device 10, a plurality of tape feeders 21, a component insertion section 40, a lead imaging device 60, and a control section 50. Note that, in the description hereinafter, the conveyance direction of the printed circuit board is an X-axis direction. In a horizontal plane, the direction which orthogonally intersects the X-axis direction is a Y-axis direction. The vertical direction which orthogonally intersects the X-axis direction and the Y-axis direction is a Z-axis direction.

A plurality of slots 22 is provided to line up in the X-axis direction on the front portion of the component inserting machine 100. Each of the tape feeders 21 is detachably mounted in each of the slots 22. A carrier tape storage section 23 which is open at the top is attached to each of the tape feeders 21 in a detachable manner. A carrier tape 900 illustrated in FIG. 2 is stored in the carrier tape storage section 23 in a folded state.

Figure 2:
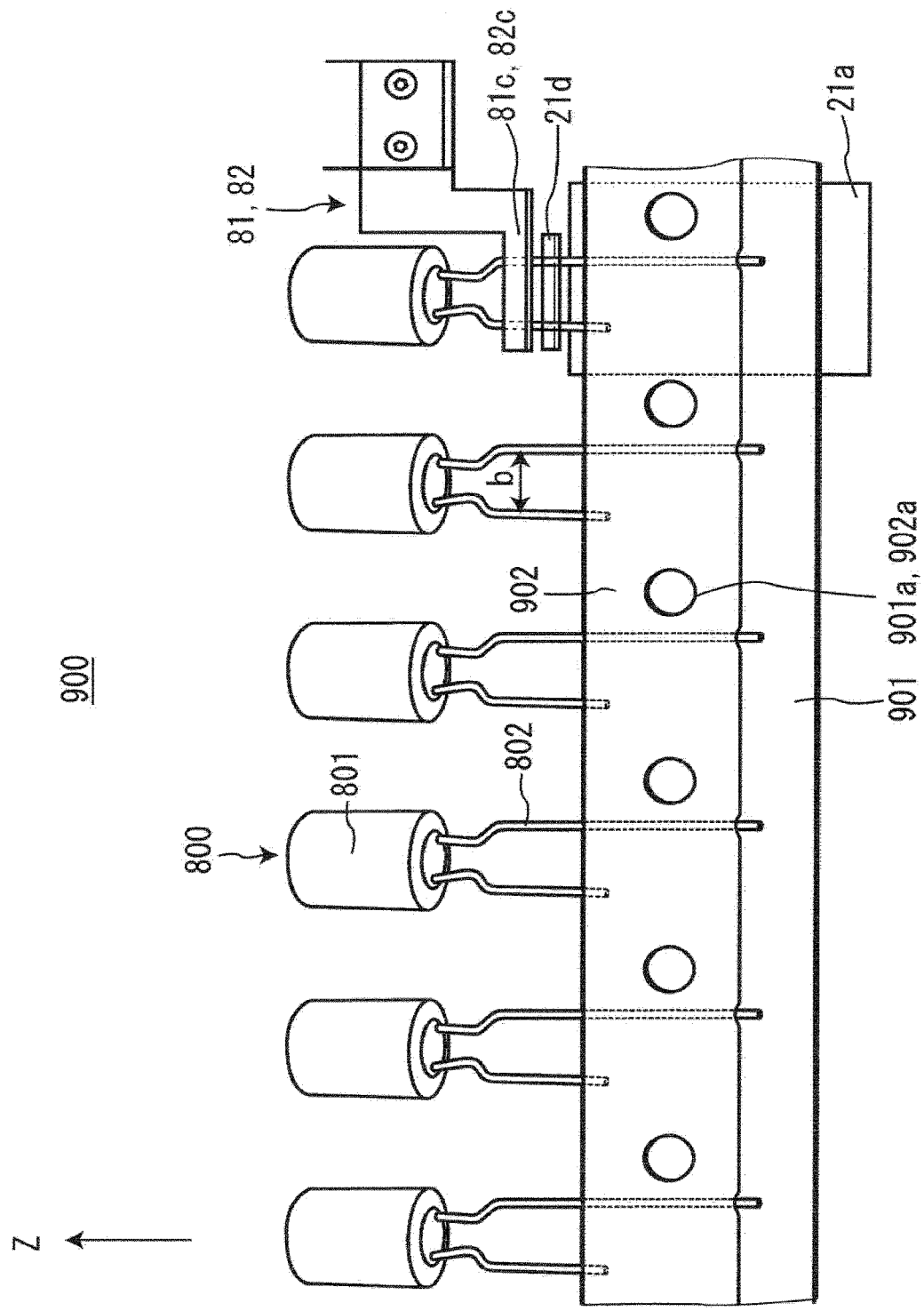
FIG. 2 is an explanatory diagram describing a carrier tape which is supplied to a component supplying section.

As illustrated in FIG. 2, the carrier tape 900 holds insert components 800 in a row. The insert component 800 includes leads 802. The leads 802 are electrically connected to an electric circuit, which is formed on a printed circuit board 700, by being inserted into insertion holes 700a (illustrated in FIG. 10) of the electronic printed circuit board 700 (hereinafter shortened simply to the printed circuit board 700). As illustrated in FIG. 2, the insert component 800 includes radial components such as a capacitor in which a plurality of the leads 802 extend from one end of a main body portion 801 in the same direction in parallel, and axial components (not shown) such as a resistor in which a pair of leads extend from each end of a main body portion.

As illustrated in FIG. 2, the carrier tape 900 is formed of a base paper tape 901, and an adhesive tape 902. The adhesive tape 902 is bonded to the base paper tape 901, the leads 802 of the insert component 800 are interposed between the adhesive tape 902 and the base paper tape 901, and the adhesive tape 902 holds the insert component 800 on the base paper tape 901. Engagement holes 901a and 902a are formed in the base paper tape 901 and the adhesive tape 902 at a fixed interval in the longitudinal direction of the tapes.

Figure 3:
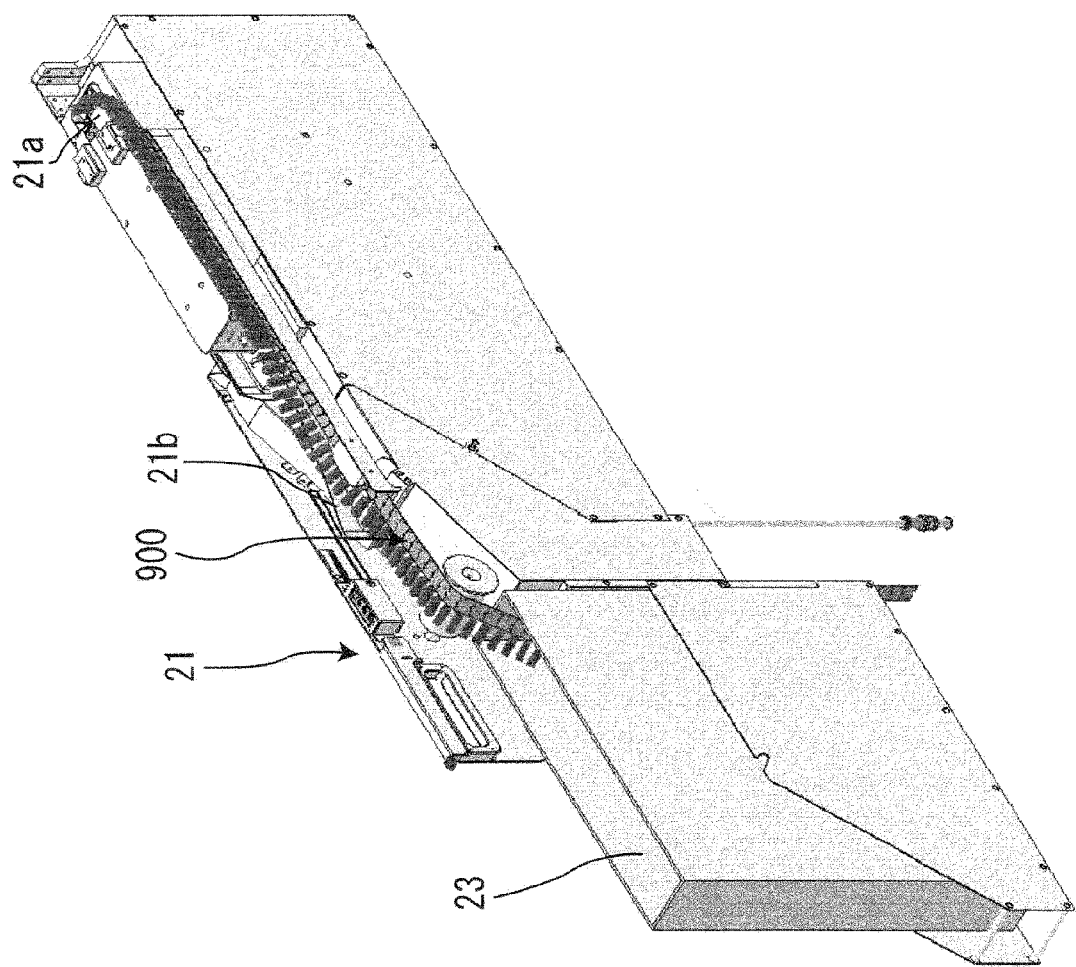
FIG. 3 is a perspective diagram of a feeder.

As illustrated in FIG. 3, the tape feeder 21 includes a sprocket (not shown) which engages with the engagement holes 901a and 902a. The sprocket is driven by a sprocket servomotor (not shown), the carrier tape 900 is fed one pitch at a time between the adjacent engagement holes 901a and 902a, and the insert components 800 which are held in the carrier tape 900 are sequentially supplied to a component supplying section 21a (illustrated in FIG. 1 and FIG. 2) of the tape feeder 21.

As illustrated in FIG. 3, the tape feeder 21 is provided with a guide 21b which changes the orientation of the carrier tape 900 to a state in which the leads 802 of the insert components 800 which are supplied to the component supplying section 21a face the Z-axis direction. As illustrated in FIG. 2, the tape feeder 21 is provided with a cutter 21d which cuts the leads 802. The cutter 21d is driven by a cutter actuator. The tape feeder 21 is provided with a lead-cutting-time gripping device (not shown) which grips the leads 802 when the leads 802 are cut by the cutter 21d.

The board conveyance device 10 includes a conveyor (not shown) which conveys the printed circuit board 700 to the component inserting machine 100 which is on the sequentially downstream side in the X-axis direction, and a clamp which in-position fixes the printed circuit board 700 in the mounting position in the conveyed component inserting machine 100. In the present embodiment, two of the board conveyance devices 10 are provided on the base 41 of the component insertion section 40 to line up in the Y-axis direction.

As illustrated in FIG. 1, the component insertion section 40 includes guide rails 42, a Y-axis slide 43, a Y-axis servo motor 44, an X-axis slide 45, an X-axis servo motor (not shown), and a gripping device 70.

A Y robot is formed of the guide rails 42, the Y-axis slide 43, and the Y-axis servo motor 44. The guide rails 42 are attached to bridge over the base 41 in the Y-axis direction and are installed above the board conveyance device 10. The Y-axis slide 43 is provided to be capable of moving in the Y-axis direction along the guide rails 42. The Y-axis slide 43 is moved in the Y-axis direction by a ball screw mechanism which includes a ball screw which is joined to the output shaft of the Y-axis servo motor 44.

An X robot is formed of the X-axis slide 45 and the X-axis servo motor. The X-axis slide 45 is provided to be capable of moving in the X-axis direction on the Y-axis slide 43. The X-axis servo motor is provided in the Y-axis slide 43. The X-axis slide 45 is moved in the X-axis direction by a ball screw mechanism which is not depicted in the drawings and is joined to the output shaft of the X-axis servo motor.

A board imaging device 46 and an attachment member 47 are provided on the bottom end of the X-axis slide 45. The attachment member 47 is moved in the Z-axis direction by a Z-axis servomotor (not shown) which is provided on the X-axis slide 45. The gripping device 70 is attached to the bottom end of the attachment member 47 in a freely detachable manner. The gripping device 70 grips the leads 802 of the insert component 800 which is supplied to the component supplying section 21a and inserts the insert component 800 into the insertion holes 700a which are formed in the printed circuit board 700. Detailed description will be given of the gripping device 70 later.

The board imaging device 46 images facing downward and images fiducial marks 701 which are formed on the printed circuit board 700 to detect the position of the printed circuit board 700. The board imaging device 46 includes an imaging element and a lens and is connected to the control section 50 to be capable of communicating therewith. Note that, in the present embodiment, two of the fiducial marks 701 are formed on a diagonal corner-to-corner line of the printed circuit board 700.

The lead imaging device 60 is attached to the base 41 between the tape feeder 21 and the board conveyance device 10. The lead imaging device 60 images the leads 802 which are gripped by the gripping device 70 by imaging facing upward to detect the distal end positions of the leads 802. The lead imaging device 60 includes an imaging element, a lens, and a lighting device, and is connected to the control section 50 to be capable of communicating therewith.

The gripping device 70 is moved above the component supplying section 21a by the Y robot and the X robot, and the gripping device 70 grips the leads 802 of the insert component 800 which is supplied to the component supplying section 21a (the state of FIG. 2). Next, the Y robot and the X robot position the gripping device 70 after moving the gripping device 70 above the lead imaging device 60. Next, the lead imaging device 60 images the leads 802. Next, the gripping device 70 is moved above the board conveyance device 10 by the Y robot and the X robot, and the gripping device 70 inserts the leads 802 of the insert component 800 into the insertion holes 700a of the printed circuit board (illustrated in FIG. 10). The X robot and the Y robot described above are the "movement device" described in the claims.

The control section 50 performs the overall control of the component inserting machine 100. The control section 50 includes an ECU which is formed of a CPU, a RAM, a memory section 50a, and a bus which connects these together. The CPU executes a program corresponding to the flowchart illustrated in FIG. 8. The RAM temporarily stores variables which are necessary for the execution of the same program. The memory section 50a is formed of non-volatile memory or the like, and stores the program and a "board position", "lead positions", and a "lead intermediate position". The control section 50 controls the servo motors, the actuators, and a switching valve of the tape feeder 21, the board conveyance device 10, and the component insertion section 40 by outputting commands thereto.

(Gripping Device)

Figure 4:
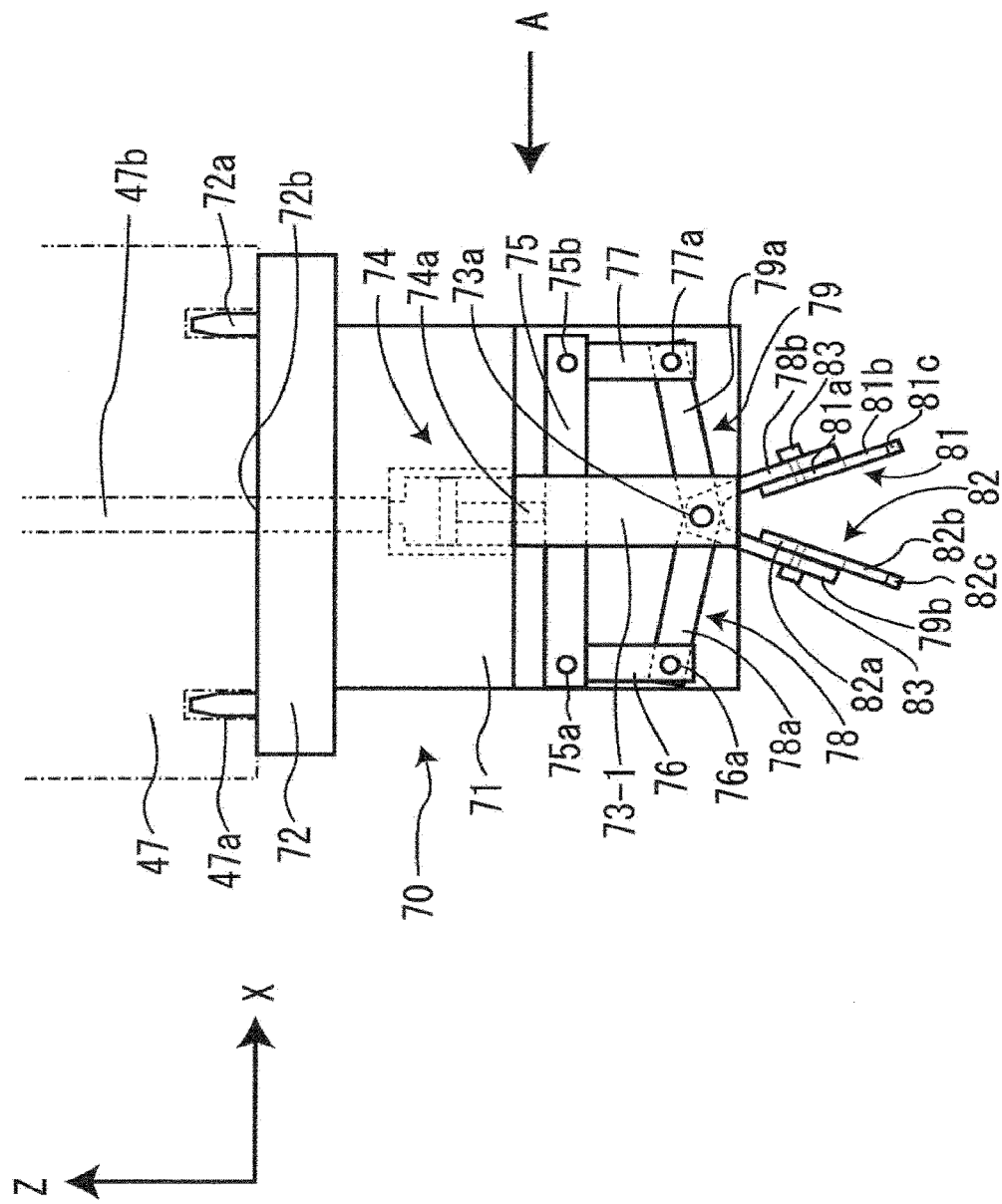
FIG. 4 is a front view of a gripping device.

Hereinafter, description will be given of the gripping device 70 using FIG. 4 and FIG. 5. The gripping device 70 includes a main body portion 71, an attachment section 72, a pair of extending members 73-1 and 73-2, a first cylinder 74, a first link member 75, a second link member 76, a third link member 77, a first clamp attachment member 78, a second clamp attachment member 79, a first clamp member 81, a second clamp member 82, and a second cylinder 85. The surface of the gripping device 70 is a dark color such as black.

The main body portion 71 is block shaped. The attachment section 72 is attached to the top end surface of the main body portion 71. A plurality of positioning protrusions 72a is attached to the top surface of the attachment section 72. The gripping device 70 is positioned on the attachment member 47 due to the positioning protrusions 72a being inserted into positioning holes 47a which are formed in the bottom end of the attachment member 47. Note that, the gripping device 70 is attached to the attachment member 47 by a fastening member such as a screw or by air suction.

An air flow path 72b is formed in the attachment section 72. The air flow path 72b is open on the top end surface of the attachment section 72, and, in addition to being connected to the opening portion of the air flow path 47b which is formed in the attachment member 47, is connected to an air flow path 71a which is formed in the main body portion 71. The air flow path 47b is connected to an air supply source (not shown) which supplies air of a negative pressure or a positive pressure. Note that, the switching between negative pressure and positive pressure is performed by the switching valve which operates according to the commands of the control section 50.

Figure 5:
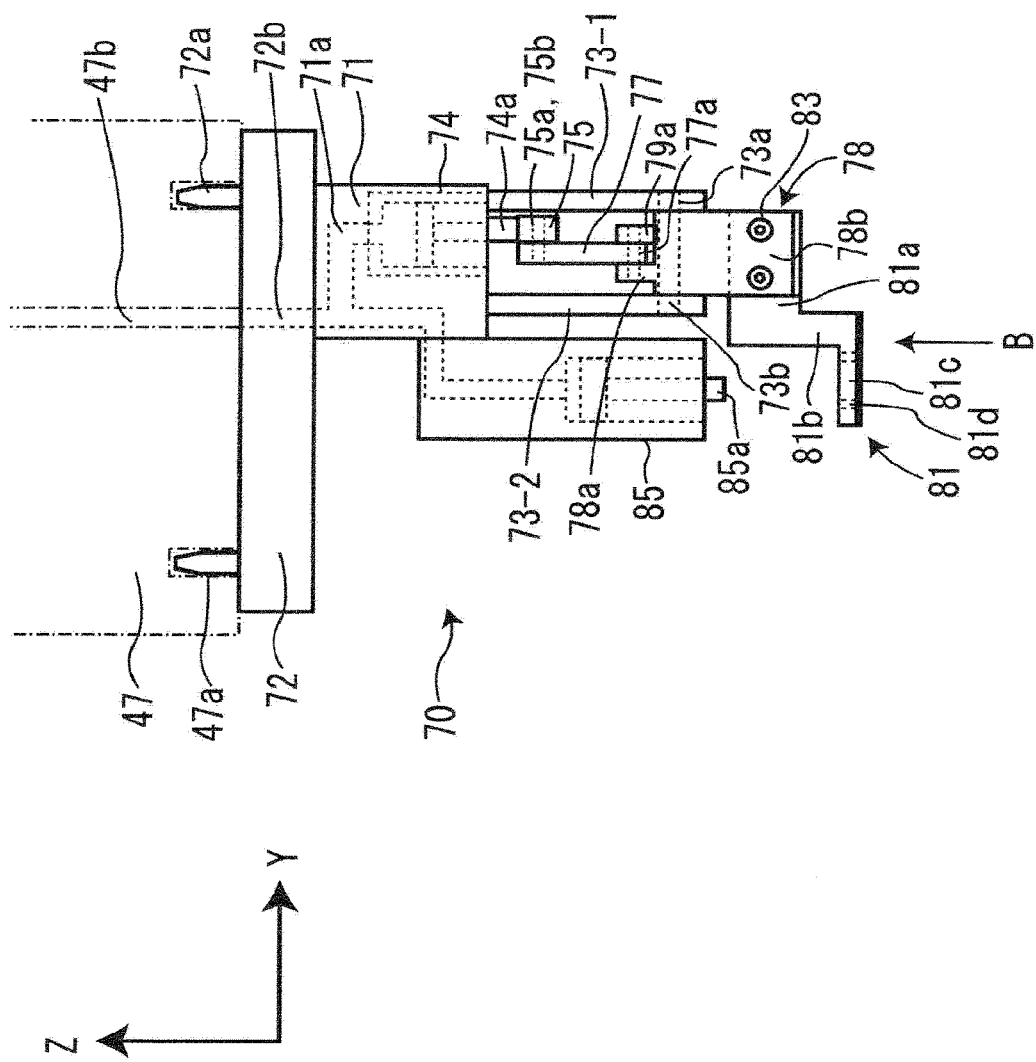
FIG. 5 is a side view of the gripping device and is the view from A in FIG. 4.

As illustrated in FIG. 5, the pair of extending members 73-1 and 73-2 face each other with an interval therebetween, and extend downward from the bottom end surface of the main body portion 71. First fulcrums 73a and 73b are formed on the bottom ends of the extending members 73-1 and 73-2, respectively.

The first cylinder 74 is attached inside the main body portion 71. The first cylinder 74 includes a first shaft 74a which protrudes downward from the bottom end surface of the main body portion 71 and slides in the vertical direction due to air. The first shaft 74a is disposed between the pair of extending members 73-1 and 73-2. The first cylinder 74 is connected to the air flow path 71a which is formed in the main body portion 71. When air of a positive pressure is supplied to the first cylinder 74, the first shaft 74a moves downward. Meanwhile, when air of a negative pressure is supplied to the first cylinder 74, the first shaft 74a moves upward.

The first link member 75 is attached to the bottom end of the first shaft 74a. The first link member 75 is rod shaped and the longitudinal direction thereof is the horizontal direction. A second fulcrum 75a and a third fulcrum 75b are formed, one on each end of the first link member 75.

The top end of the second link member 76 is axially attached to the second fulcrum 75a of the first link member 75. The second link member 76 is rod shaped and the longitudinal direction thereof is the vertical direction. A fourth fulcrum 76a is formed on the bottom end of the second link member 76.

The top end of the third link member 77 is axially attached to the third fulcrum 75b of the first link member 75. The third link member 77 is rod shaped and the longitudinal direction thereof is the vertical direction. A fifth fulcrum 77a is formed on the bottom end of the third link member 77.

The first clamp attachment member 78 is formed of a base arm 78a and an attachment arm 78b which is connected to the distal end of the base arm 78a. The first clamp attachment member 78 bends at the center portion thereof, and the longitudinal directions of the base arm 78a and the attachment arm 78b are different. The base end of the base arm 78a is axially attached to the fourth fulcrum 76a of the second link member 76. The connecting portion of the base arm 78a and the attachment arm 78b is axially attached to the first fulcrums 73a and 73b of the extending members 73-1 and 73-2.

The second clamp attachment member 79 is formed of abase arm 79a and an attachment arm 79b which is connected to the distal end of the base arm 79a. The second clamp attachment member 79 bends at the center portion thereof, and the longitudinal directions of the base arm 79a and the attachment arm 79b are different. The base end of the base arm 79a is axially attached to the fifth fulcrum 77a of the third link member 77. The connecting portion of the base arm 79a and the attachment arm 79b is axially attached to the first fulcrums 73a and 73b of the extending members 73-1 and 73-2. As illustrated in FIG. 4, the first clamp attachment member 78 and the second clamp attachment member 79 intersect at the first fulcrums 73a and 73b.

The first clamp member 81 is formed of an attachment section 81a, a connection section 81b, and a first gripping section 81c, and these are formed integrally. The attachment section 81a is positioned by a plurality of fastening members 83 such as screws and is attached to the attachment arm 78b of the first clamp attachment member 78. The first gripping section 81c is rod shaped and the longitudinal direction thereof is the horizontal direction. The connection section 81b extends downward from the attachment section 81a and connects the attachment section 81a to the first gripping section 81c.

The second clamp member 82 is formed of an attachment section 82a, a connection section 82b, and a second gripping section 82c, and these are formed integrally. The attachment section 82a is positioned by the plurality of fastening members 83 such as screws and is attached to the attachment arm 79b of the second clamp attachment member 79. The second gripping section 82c is rod shaped and the longitudinal direction thereof is the horizontal direction. The connection section 82b extends downward from the attachment section 82a and connects the attachment section 82a to the second gripping section 82c.

Figure 6:
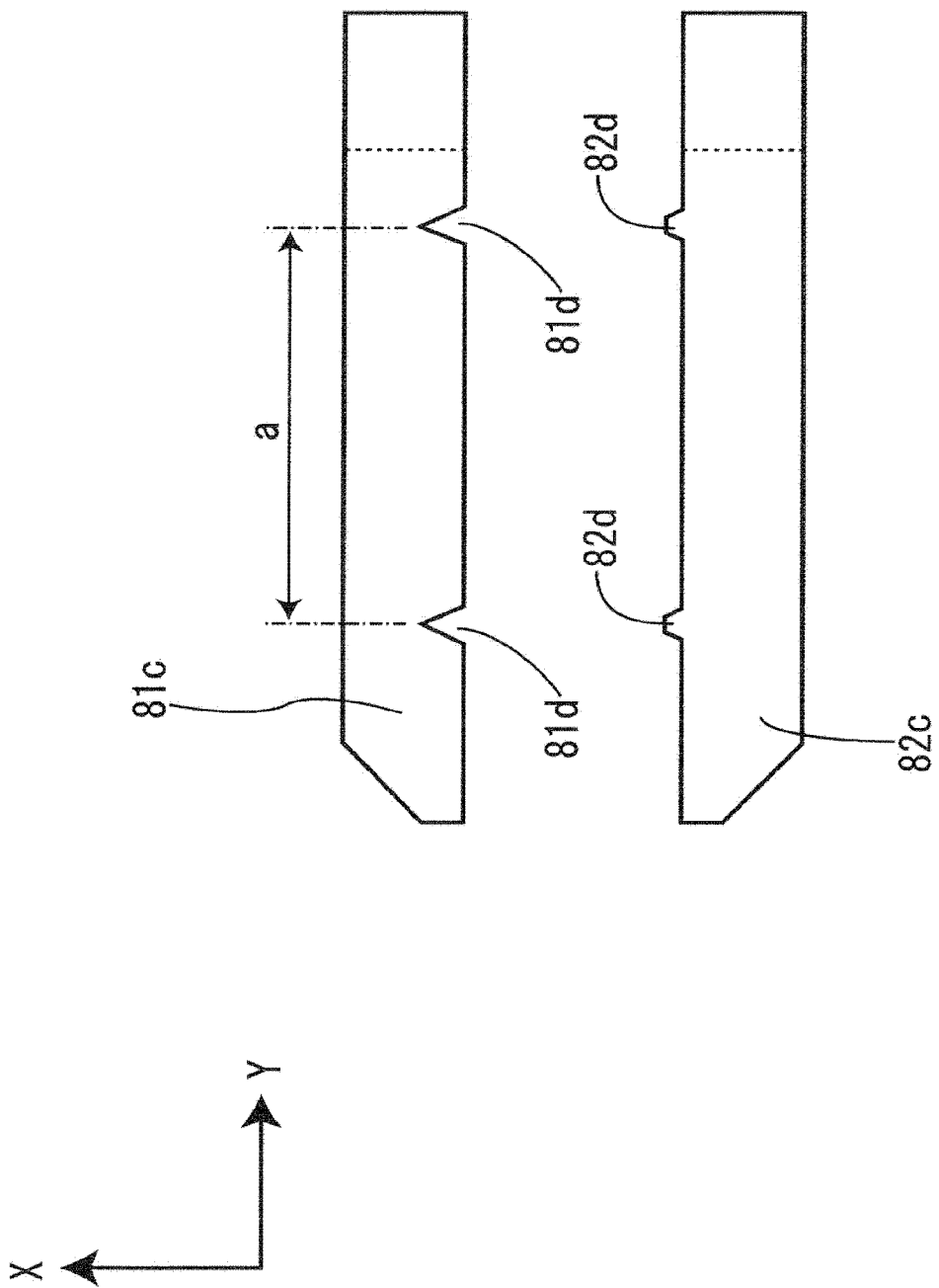
FIG. 6 is a detailed diagram of a state in which a pair of clamp sections is open and is the view from B in FIG. 5.

As illustrated in FIG. 6, the first gripping section 81c and the second gripping section 82c face each other. When air of a positive pressure is supplied to the first cylinder 74, the first shaft 74a slides downward, and the first gripping section 81c and the second gripping section 82c assume an open (separated) state (the state of FIG. 4 and FIG. 6) due to the linked operation of the first link member 75, the second link member 76, the third link member 77, the first clamp attachment member 78, and the second clamp attachment member 79. Meanwhile, when air of a negative pressure is supplied to the first cylinder 74, the first shaft 74a slides upward, and the first gripping section 81c and the second gripping section 82c assume a closed state (the state of FIG. 7) due to the linked operation of the first link member 75, the second link member 76, the third link member 77, the first clamp attachment member 78, and the second clamp attachment member 79.

The second cylinder 85 is attached inside the main body portion 71. The second cylinder 85 is connected to the air flow path 72b. The second cylinder 85 includes a second shaft 85a which protrudes downward from the bottom end of the second cylinder 85 and slides in the vertical direction. In the state in which the first gripping section 81c and the second gripping section 82c are closed, the second shaft 85a is positioned above the first gripping section 81c and the second gripping section 82c. When air of a positive pressure is supplied to the second cylinder 85, the second shaft 85a slides downward and approaches the first gripping section 81c and the second gripping section 82c side. When air of a negative pressure is supplied to the second cylinder 85, the second shaft 85a slides upward.

As illustrated in FIG. 6, a pair of lead position restriction grooves 81d is formed on the surface of the first gripping section 81c which faces the second gripping section 82c. In the present embodiment, the shape of the lead position restriction groove 81d is a V-shaped groove. A distance a between the bottom portions of the pair of lead position restriction grooves 81d is the same as a distance b (illustrated in FIG. 2) between the pair of leads 802 of the insert component 800, and is the same as the distance between the pair of insertion holes 700a into which the pair of leads 802 is inserted.

Figure 7:
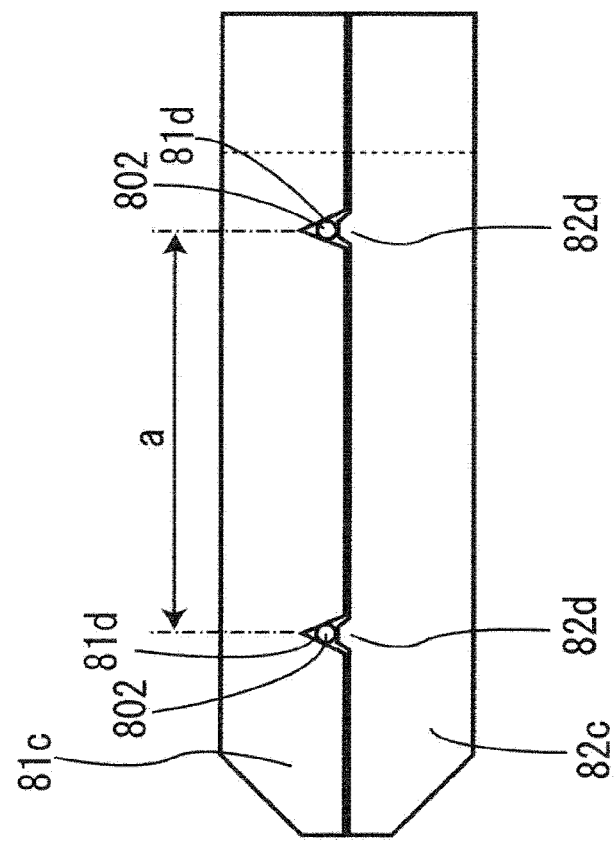
FIG. 7 is a detailed diagram of a state in which the pair of clamp sections is closed.
Figure 7:
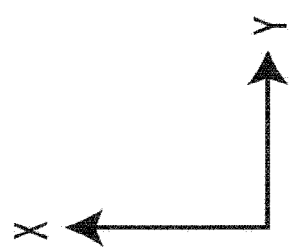

A pair of lead position restriction protrusions 82d is formed in the same position as the lead position restriction grooves 81d in relation to the longitudinal direction of the surface of the second gripping section 82c which faces the first gripping section 81c. As illustrated in FIG. 7, in the state in which the first gripping section 81c and the second gripping section 82c are closed, the pair of lead position restriction protrusions 82d enters the pair of lead position restriction grooves 81d.

(Insertion Mounting Process)

Hereinafter, description will be given of an "insertion mounting process" using the flowchart illustrated in FIG. 8. When the "insertion mounting process" starts, the program proceeds to S11.

In S11, the control section 50 conveys the printed circuit board 700 from the component inserting machine 100 of the upstream side by controlling the servo motor which drives the conveyor of the board conveyance device 10. Next, the control section 50 in-position fixes the conveyed printed circuit board 700 using the clamp by controlling the servomotor to drive the clamp of the board conveyance device 10. When S11 is completed, the program proceeds to S12.

In S12, the control section 50 moves the board imaging device 46 over the fiducial marks 701 which are formed on the printed circuit board 700 by controlling the Y-axis servomotor 44 and the X-axis servo motor and images the fiducial marks 701 using the board imaging device 46. Next, the control section 50 acquires the position of the printed circuit board 700 (hereinafter shortened to the "board position" which includes the X and Y direction positions and inclination) in the coordinates of the component inserting machine 100 (hereinafter shortened to the "inserter coordinates") by subjecting the fiducial marks 701 which are imaged by the board imaging device 46 to image analysis, and stores the "board position" in the memory section 50a. When S12 is completed, the program proceeds to S13.

In S13, the control section 50 rotates the sprocket to feed the carrier tape 900 by one pitch and supply the insert component 800 to the component supplying section 21*a* by controlling the sprocket servo motor. When S13 is completed, the program proceeds to S14.

In S14, the control section 50 causes the pair of leads 802 of the insert component 800, which is supplied to the component supplying section 21*a*, to be gripped by the lead-cutting-time gripping device. Next, the control section 50 cuts the bottom portion of the pair of leads 802 using the cutter 21*d* by controlling the cutter actuator. When S14 is completed, the program proceeds to S15.

In S15, the control section 50 moves the gripping device 70 to the component supplying section 21*a* by controlling the Y-axis servo motor 44 and the X-axis servo motor, and interposes the pair of leads 802 of the insert component 800 which is supplied to the component supplying section 21*a* between the first gripping section 81*c* and the second gripping section 82*c* in a state in which the first gripping section 81*c* and the second gripping section 82*c* are separated. Next, the control section 50 supplies a negative pressure to the first cylinder 74 by supplying air of a negative pressure to the gripping device 70 by controlling the switching valve, and grips the pair of leads 802 using the first gripping section 81*c* and the second gripping section 82*c* (the state of FIG. 2 and FIG. 7).

In this case, as illustrated in FIG. 7, the pair of leads 802 is pushed into the lead position restriction grooves 81*d* by the pair of lead position restriction protrusions 82*d*, respectively. Therefore, assuming that the leads 802 of the insert component 800 which is supplied to the component supplying section 21*a* are warped, the distance between the pair of leads 802 is corrected to an appropriate inter-lead distance a and the leads 802 are positioned in the first gripping section 81*c* and the second gripping section 82*c* due to the leads 802 being pushed into the lead position restriction grooves 81*d*. Next, the control section 50 releases the gripping of the pair of leads 802 by the lead-cutting-time gripping device. When S15 is completed, the program proceeds to S16.

In S16, when the control section 50 determines that it is necessary to acquire the "lead positions" (yes in S16), the program proceeds to S17, and when the control section 50 determines that it is not necessary to acquire the "lead positions" (no in S16), the program proceeds to S18. Note that, the cases in which it is determined that it is not necessary to acquire the "lead positions" include (1) when the "lead positions" are not stored in the memory section 50*a*, (2) when the gripping device 70 is attached to the attachment member 47 and the insert component 800 is first insertion mounted on the printed circuit board, and (3) when the first clamp member 81 and the second clamp member 82 are replaced and the insert component 800 is first insertion mounted on the printed circuit board.

In S17, the gripping device 70 is moved over the lead imaging device 60 by controlling the Y-axis servomotor 44 and the X-axis servo motor. Next, the control section 50 acquires a lead-containing image 600 (illustrated in FIG. 9) by imaging the pair of leads 802 which are gripped by the first gripping section 81*c* and the second gripping section 82*c* from below using the lead imaging device 60. In the lead-containing image 600 of FIG. 9, the brightest portions are the leads 802, the darkest portions are the first gripping section 81*c* and the second gripping section 82*c*, and the other portions are a background 999. Note that, the luminance value of the captured portions of the first gripping section 81*c* and the second gripping section 82*c* is a value which is close to the luminance value of the background 999 in comparison with the luminance value of the leads 802. If there is a sufficient difference between the luminance value of the leads 802 and the luminance value of the portions other than the leads 802, it is possible to prevent erroneous recognition of the portions other than the leads 802 as the leads 802 when recognizing the positions of the leads 802 by subjecting the lead-containing image 600 to image processing. Note that, the luminance value of the portions of the first gripping section 81*c* and the second gripping section 82*c* which are imaged by the lead imaging device 60 can be adjusted by changing any of the material, color, and the surface treatment method. When S17 is completed, the program proceeds to S18.

In S18, the control section 50 (the lead position detection section) acquires the center positions (hereinafter shortened to the "lead positions") of the distal ends of the pair of leads 802 in the "inserter coordinates" or the "captured image coordinates" by subjecting the lead-containing image 600 to grayscale processing which classifies a predetermined number of gradations from white to black, and detecting the edges of the distal ends of the leads 802. Next, the control section 50 calculates the intermediate position (hereinafter shortened to the "lead intermediate position") of the leads 802 from the pair of "lead positions", and stores the "lead intermediate position" in the memory section 50*a*. When S18 is completed, the program proceeds to S19.

In S19, the control section 50 calculates the relative positions of the pair of leads 802 which are gripped by the first gripping section 81*c* and the second gripping section 82*c* and the insertion holes 700*a* into which the pair of leads 802 are inserted based on the "board position" and the "lead intermediate position" which are stored in the memory section 50*a*, and calculates the movement amount of the insert component 800 which is gripped by the gripping device 70 (hereinafter shortened to the "component movement amount"). When S19 is completed, the program proceeds to S20.

Figure 10:
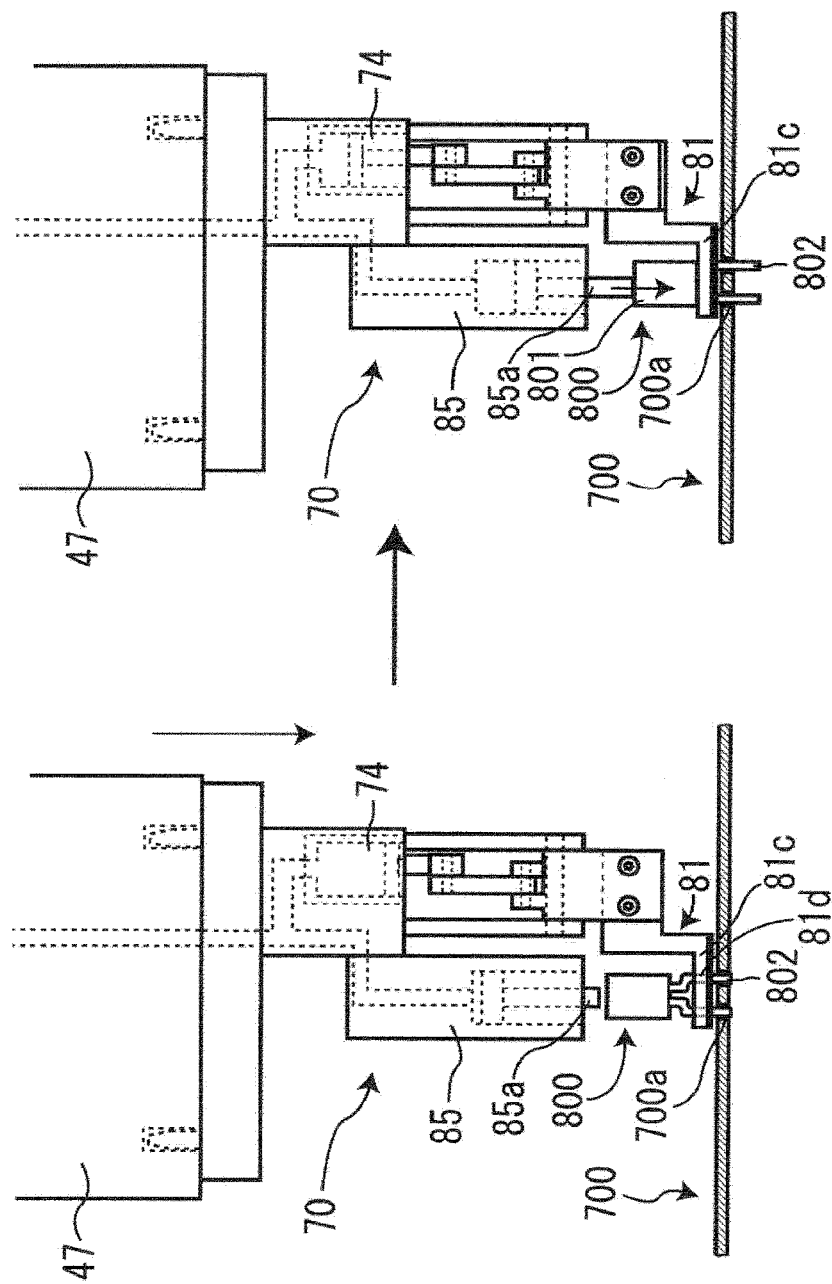
FIG. 10 is an explanatory diagram illustrating a state in which insertion mounting of an insert component to an electronic printed circuit board is being performed by the gripping device.

In S20, the control section 50 moves the insert component 800 which is gripped by the gripping device 70 by the "component movement amount" which is calculated in S19 and moves the pair of leads 802 directly above the pair of insertion holes 700*a* by controlling the X-axis servo motor and the Y-axis servo motor 44. Next, the control section 50 lowers the gripping device 70 by controlling the Z-axis servo motor, and, as illustrated in FIG. 10, inserts the pair of leads 802 which are gripped by the gripping device 70 into the pair of insertion holes 700*a*. When S20 is completed, the program proceeds to S21.

In S21, the control section 50 supplies air of a positive pressure to the first cylinder 74 and the second cylinder 85 to open the clamp members 81 and 82 by supplying air of a positive pressure to the gripping device 70 by controlling the switching valve, and, as illustrated in FIG. 10, pushes the insert component 800 to the printed circuit board 700 side by pressing the main body portion 801 using the second shaft 85*a*. Accordingly, the leads 802 are reliably inserted into the insertion holes 700*a*. When S21 is completed, the program proceeds to S22.

In S22, when the control section 50 determines that all of the insert components 800 to be inserted in the component inserting machine 100 have been inserted into the insertion holes 700*a* which are formed in the printed circuit board 700 (yes in S22), the program returns to S11, and when the control section 50 determines that all of the insert components 800 to be inserted in the component inserting machine 100 have not been inserted into the insertion holes which are formed in the printed circuit board 700 (no in S22), the program returns to S13.

(Effects of Present Embodiment)

As is clear from the description given above, since the "lead positions" are detected (S18) by imaging (S17 of FIG. 8) the leads 802 in a state in which the leads are gripped by the clamp members 81 and 82, it is possible to suppress the inclination of the insert component 800 during the imaging. Since the insert component 800 of the portions other than the distal ends of the leads 802 is hidden by the clamp members 81 and 82 (FIG. 7), the base portion of the main body portion 801 from which the metallic colored leads 802 extend does not appear in the lead-containing image 600 (FIG. 9). Therefore, it is possible to distinguish the leads 802 and the other portions, it is possible to recognize the distal ends of the leads 802, and it is possible to detect the "lead positions".

The control section 50 moves the gripping device 70 using the X and Y robots (the movement device) based on the "lead positions" (S20). Therefore, when the gripping device 70 is detached from the attachment member 47 or when the clamp members 81 and 82 are replaced, even if the positions of the leads 802 which are gripped by the clamp members 81 and 82 are shifted, or, regardless of the manufacturing error of the gripping device 70 or the X and Y robots, it is possible to reliably insert the leads 802 into the insertion holes 700a, and it is possible to reliably insertion mount the insert component 800 on the electronic printed circuit board 700. In this manner, since the "lead positions" are detected by the lead imaging device 60 and the insertion mounting is performed based on the "lead positions", it is not necessary to manage the positions of the lead position restriction grooves 81d of the first clamp member 81 at high precision, it is possible to reduce the amount of work necessary for the management, and it is possible to reduce the cost of the insertion mounting.

As illustrated in FIG. 6, the lead position restriction grooves 81d which restrict the positions of the leads 802 in relation to the clamp members 81 and 82 when gripping the leads 802 are formed in the first clamp member 81. Accordingly, when the leads 802 are gripped by the clamp members 81 and 82, since the leads 802 are corrected by the lead position restriction grooves 81d, and since the inter-lead distance is corrected to an appropriate value, it is possible to reliably insert the leads 802 into the insertion holes 700a.

Figure 8:
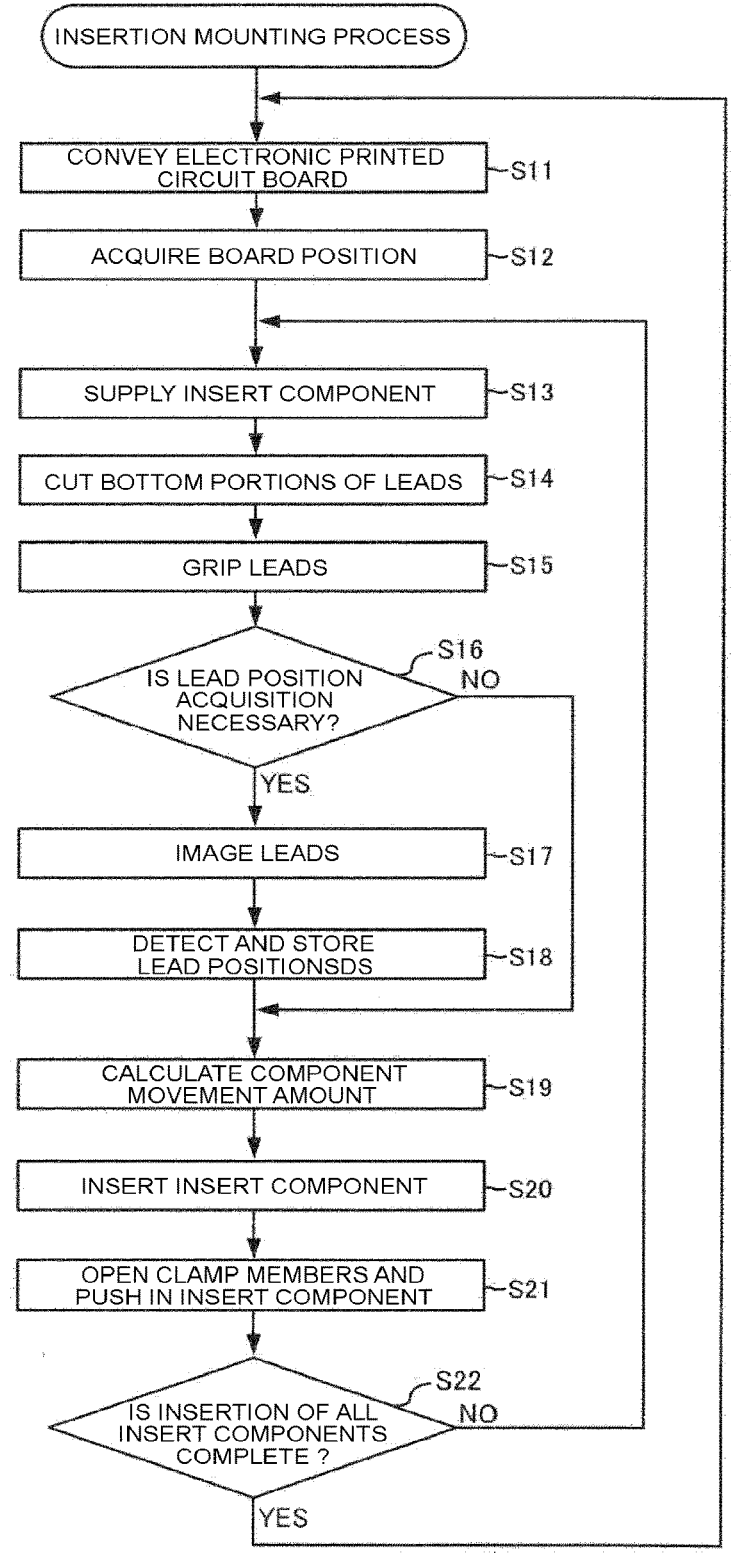
FIG. 8 is a flowchart of an insertion mounting process.
Figure 9:
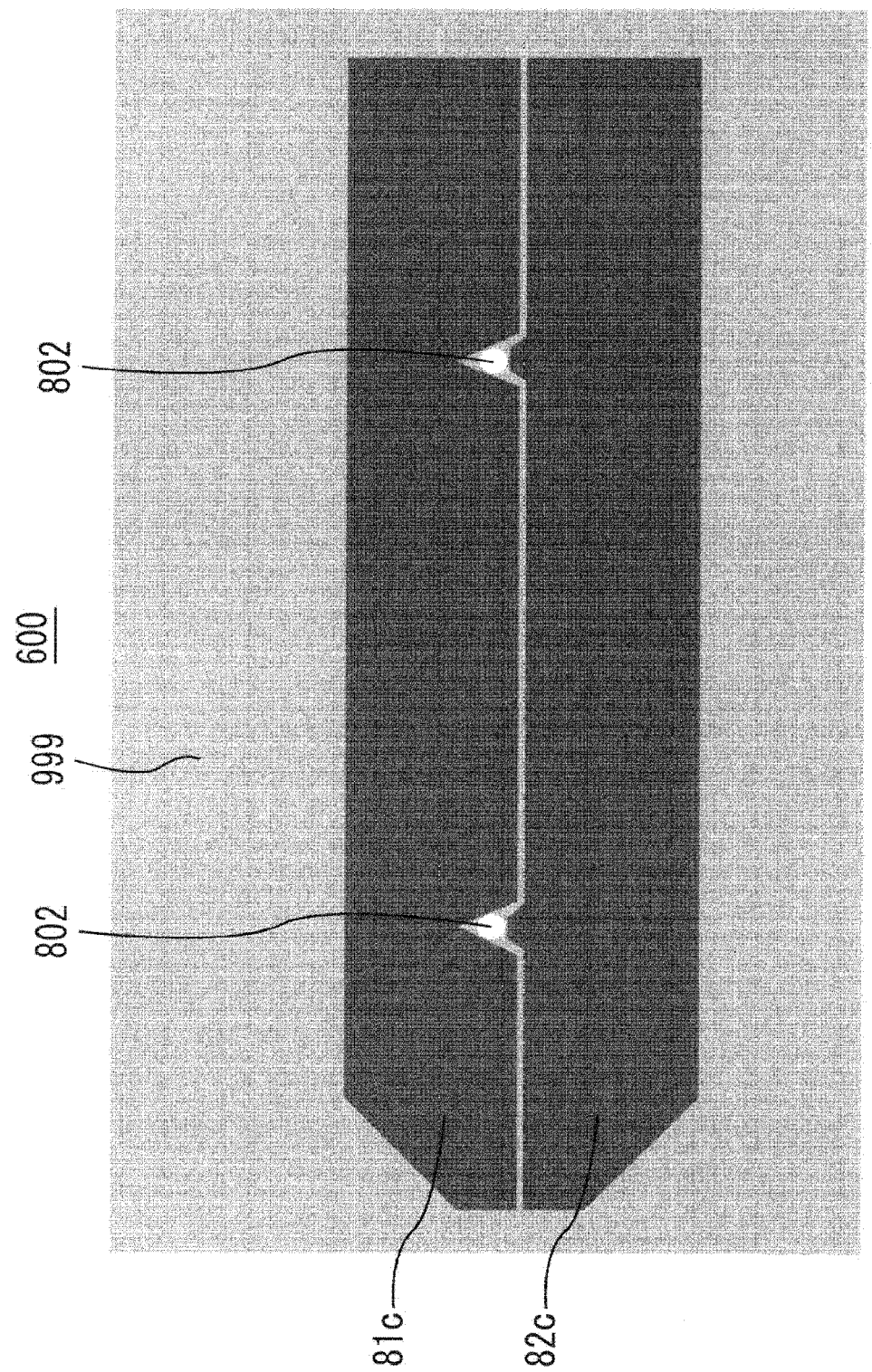
FIG. 9 is a diagram illustrating a lead-containing image.

For the following insert components for which the "lead positions" are detected (S16 of FIG. 8 is determined to be no), the "component movement amount" is calculated based on the "lead positions" which are stored in the memory section 50a (S19), and the leads 802 are inserted into the insertion holes (S20). As described above, when the leads 802 are gripped by the pair of clamp members 81 and 82, the distal ends of the leads 802 are corrected by the lead position restriction grooves 81d (S14, FIG. 7). Once the "lead positions" are detected, the distal ends of the leads 802 of the insert components 800 which are supplied to the component supplying section 21a are corrected to the "lead positions", even if the "lead positions" are not detected every time. Therefore, it is possible to reliably insert the leads 802 into the insertion holes 700a. In this manner, since it is not necessary to perform the detection of the "lead positions" (S17, S18) for every insertion mounting of the insert component 800, it is possible to shorten the cycle time in which the leads 802 are inserted into the insertion holes 700a, and the productivity of the insertion mounting is improved.

As illustrated in FIG. 6 and FIG. 7, the lead position restriction grooves 81d are V-shaped grooves. Accordingly, when the leads 802 are gripped by the clamp members 81 and 82, the leads 802 are pushed into the bottom portion side of the lead position restriction grooves 81d which are V-shaped grooves by the lead position restriction protrusions 82d, and it is possible to reliably correct the leads 802. It is possible to adapt this to leads 802 which have different wire diameters.

As illustrated in FIG. 7, the gripping device 70 is configured such that the base portion of the insert component 800 from which the leads 802 extend is hidden by the clamp members 81 and 82 when viewing the side of the insert component 800 which is gripped by the pair of clamp members 81 and 82 from the lead imaging device 60. Accordingly, as illustrated in FIG. 9, since the base portion of the insert component 800 does not appear in the lead-containing image 600 which is captured by the lead imaging device 60, it is possible to reliably recognize the distal end of the leads 802 and it is possible to reliably detect the "lead positions".

Since the pair of clamp members 81 and 82 is a dark color, the pair of clamp members 81 and 82 has a brightness difference in relation to the leads 802. Accordingly, it is possible to reliably distinguish the distal ends of the leads 802 and the clamp members 81 and 82, it is possible to reliably recognize the distal ends of the leads 802, and it is possible to reliably detect the "lead positions".

(Other Embodiment)

In the embodiment which is described above, the lead position restriction grooves 81d are only formed in the first clamp member 81. However, there is no problem even if an embodiment is adopted in which the lead position restriction grooves are formed in both the first clamp member 81 and the second clamp member 82. In the embodiment which is described above, the lead position restriction grooves 81d are V-shaped grooves; however, there is no problem even if the lead position restriction grooves 81d are U-shaped grooves or the like.

In the embodiment which is described above, the "lead intermediate position" is calculated from the pair of "lead positions". However, there is no problem even if an embodiment is adopted in which the "component movement amount" is calculated from the "board position" and the pair of "lead positions" without calculating the "lead intermediate position".

In the embodiment which is described above, the lead imaging device 60 is attached to the base 41. However, there is no problem even if an embodiment is adopted in which the lead imaging device 60 is provided on the X-axis slide 45 or the gripping device 70.

REFERENCE SIGNS LIST

41 . . . base (main body), 42 . . . guide rail (movement device), 43 . . . Y-axis slide (movement device), 44 . . . Y-axis servo motor (movement device), 45 . . . X-axis slide (movement device), 50 . . . control section (lead position detection section), 50a . . . memory section (lead position memory section), 60 . . . lead imaging device (imaging device), 70 . . . gripping device, 81 . . . first clamp member, 81d . . . lead position restriction groove (lead position restriction section), 82 . . . second clamp member, 82d . . . lead position restriction protrusion (lead position restriction section), 100 . . . component inserting machine, 700 . . . electronic printed circuit board, 700a . . . insertion hole, 800 . . . insert component, 802 . . . lead

The invention claimed is:

1. A lead position detecting apparatus, comprising:
a main body;
a gripping device which grips leads of an insert component in an axial direction of the leads, the gripping device including a first clamp and a second clamp;
a movement device which is attached to the main body arid moves the gripping device;
an imaging device which images the leads which are gripped by the first clamp and the second clamp; and
a lead position detection section which detects lead positions from an image containing the leads which are imaged by the imaging device, wherein
the first clamp includes at least one lead position restriction groove extending an entire height of the first clamp to accommodate an axial length of the leads and the second clamp includes at least one lead position restriction protrusion, and
when the gripping device grips the leads the least one lead position restriction protrusion enters the at least one lead position restriction groove with the leads therebetween.

2. The lead position detecting apparatus according to claim 1,
wherein each of the leads of the component are gripped by one of the at least one lead position restriction grooves and one of the at least one lead position restriction protrusions.

3. A component inserting machine which inserts leads of an insert component into insertion holes of an electronic printed circuit board to mount the insert component on the electronic printed circuit board, the component inserting machine comprising:
a main body;
a gripping device which grips the leads of the insert component in an axial direction of the leads, the insert component being supplied to a component supplying section, the gripping device including a first clamp and a second clamp;
a movement device which is attached to the main body and moves the gripping device;
an imaging device which images the leads which are gripped by the first clamp and the second clamp;
a lead position detection section which detects lead positions from an image containing the leads which are imaged by the imaging device; and
a control section which inserts the leads which are gripped by the first clamp and the second clamp into the insertion holes by moving the gripping device using the movement device based on the lead positions which are detected by the lead position detection section,
wherein the first clamp includes at least one lead position restriction groove extending an entire height of the first clamp to accommodate an axial length of the leads and the second clamp includes at least one lead position restriction protrusion.

4. The component inserting machine according to claim 3, wherein the first clamp and the second clamp include lead position restriction sections which restrict positions of the leads when gripping the leads.

5. The component inserting machine according to claim 4, further comprising:
a lead position memory section which stores the lead positions which are detected by the lead position detection section,
wherein, for the insert components after the lead positions are detected by the lead position detection section, the control section causes the leads which are gripped by the gripping device to be inserted into the insertion holes by moving the gripping device using the movement device based on the lead positions which are stored in the lead position memory section.

6. The component inserting machine according to claim 3, wherein the at least one lead position restriction groove is V-shaped.

7. The component inserting machine according to claim 3, wherein the gripping device is configured such that a base portion of the insert component from which the leads extend is hidden by the first clamp and the second clamp when viewing the insert component which is gripped by the first clamp and the second clamp from the imaging device.

8. The component inserting machine according to claim 3, wherein the first clamp and the second clamp has a brightness difference in relation to the leads.

* * * * *